US008644072B2

(12) United States Patent
Nagashima

(10) Patent No.: US 8,644,072 B2
(45) Date of Patent: Feb. 4, 2014

(54) THREE DIMENSIONALLY STACKED MEMORY AND THE ISOLATION OF MEMORY CELL LAYER

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 12/532,841

(22) PCT Filed: Dec. 22, 2008

(86) PCT No.: PCT/JP2008/073905
§ 371 (c)(1),
(2), (4) Date: Sep. 24, 2009

(87) PCT Pub. No.: WO2009/096136
PCT Pub. Date: Aug. 6, 2009

(65) Prior Publication Data
US 2010/0085820 A1    Apr. 8, 2010

(30) Foreign Application Priority Data

Jan. 28, 2008  (JP) ................................. 2008-016252

(51) Int. Cl.
*G11C 11/34* (2006.01)
*G11C 16/04* (2006.01)
(52) U.S. Cl.
USPC ................................. 365/185.11; 365/185.17
(58) Field of Classification Search
USPC ................................ 365/200, 185.01–185.33
See application file for complete search history.

(56) References Cited

U.S. PATENT DOCUMENTS 5,107,459 A    4/1992  Chu et al.
6,136,650 A    10/2000  Lee
(Continued)

FOREIGN PATENT DOCUMENTS

EP    0 452 648    10/1991
FR    2 891 945    4/2007
(Continued)

OTHER PUBLICATIONS

Chinese Office Action Issued May 16, 2012 in Patent Application No. 200880006997.4 (with English translation).

(Continued)

*Primary Examiner* — Vanthu Nguyen
*Assistant Examiner* — Khamdan Alrobaie
(74) *Attorney, Agent, or Firm* — Oblon, Spivak, McClelland, Maier & Neustadt, L.L.P.

(57) ABSTRACT

There is provided a semiconductor memory device having a plurality of memory cell layers which can be used even if part of the memory cell layers is determined as defective. The semiconductor memory device includes a stacked memory cell array having a laminated plurality of memory cell layers, each of which has a plurality of blocks; a layer quality information storing circuit (10) which can store layer quality information indicating whether the individual memory cell layer is a normal memory cell layer or a defective memory cell layer so as to identify a memory cell layer in which the number of defective blocks found is equal to or greater than a predetermined number as a defective memory cell layer and the other memory cell layers as normal memory cell layers; and address converting circuit (11) in which if an externally input address input from outside corresponds to the block in the defective memory cell layer, the externally input address is address-converted so as to correspond to the block of the normal memory cell layer.

23 Claims, 18 Drawing Sheets

(56) References Cited

U.S. PATENT DOCUMENTS

| | | | |
|---|---|---|---|
| 6,367,030 B1* | 4/2002 | Yamauchi | 714/6.32 |
| 7,164,599 B2* | 1/2007 | Hosotani et al. | 365/158 |
| 7,706,167 B2 | 4/2010 | Toda et al. | |
| 7,719,875 B2 | 5/2010 | Toda et al. | |
| 7,755,934 B2 | 7/2010 | Toda et al. | |
| 7,859,885 B2 | 12/2010 | Toda | |
| 7,885,139 B2 | 2/2011 | Ryu et al. | |
| 2001/0009519 A1* | 7/2001 | Fujisawa et al. | 365/51 |
| 2002/0083291 A1 | 6/2002 | Yoshimura | |
| 2003/0133333 A1 | 7/2003 | Eldredge et al. | |
| 2003/0177415 A1* | 9/2003 | Togashi et al. | 714/30 |
| 2004/0085825 A1* | 5/2004 | Narita et al. | 365/200 |
| 2006/0018166 A1* | 1/2006 | Iaculo et al. | 365/200 |
| 2006/0203541 A1 | 9/2006 | Toda | |
| 2006/0221728 A1* | 10/2006 | Fasoli et al. | 365/200 |
| 2007/0165461 A1* | 7/2007 | Cornwell et al. | 365/185.33 |
| 2008/0031061 A1* | 2/2008 | Roohparvar | 365/200 |
| 2009/0231897 A1 | 9/2009 | Ryu et al. | |
| 2009/0244975 A1* | 10/2009 | Kang | 365/185.11 |

FOREIGN PATENT DOCUMENTS

| | | |
|---|---|---|
| JP | 2-166544 | 6/1990 |
| JP | 03-168998 | 7/1991 |
| JP | 4-181589 | 6/1992 |
| JP | 7-73693 | 3/1995 |
| JP | 07-85696 | 3/1995 |
| JP | 07-262790 | 10/1995 |
| JP | 9 7390 | 1/1997 |
| JP | 9 146849 | 6/1997 |
| JP | 9-265792 | 10/1997 |
| JP | 11-73796 | 3/1999 |
| JP | 11-96081 | 4/1999 |
| JP | 2009-134846 | 6/2009 |
| KR | 10-2005-0110680 | 11/2005 |

OTHER PUBLICATIONS

Office Action issued Mar. 2, 2012, in Japanese Patent Application No. 2008-016252 with English translation.

Japanese Office Action issued Jun. 5, 2012 in patent application No. 2008-016252 with English translation.

Office Action issued on Feb. 5, 2013, in Chinese Patent Application No. 200880006997.4 with English translation.

Office Action mailed Aug. 12, 2013 in Chinese Patent Application No. 200880006997.4 (with English Translation).

Office Action issued on Feb. 7, 2011 in the corresponding Korean Patent Application No. 10-2009-7018417 (with English Translation).

* cited by examiner

| Layer0 | 0 | 1 | 2 | ... | 1023 |
|--------|------|------|------|-----|------|
| Layer1 | 1024 | 1025 | 1026 | ... | 2047 |
| Layer2 | 2048 | 2049 | 2050 | ... | 3071 |
| Layer3 | 3072 | 3073 | 3074 | ... | 4095 |

FIG.3A

| Layer0 | 0 | 1 | 2 | ... | 1023 |
|--------|------|---|------|-----|------|
| Layer1 | -    | - | -    | ... | -    |
| Layer2 | 1024 | - | 1026 | ... | 2047 |
| Layer3 | -    | - | -    | ... | -    |

FIG.3B

| Rom Fuse [3:0] | | | |
|---|---|---|---|
| Rom Fuse [0] (Layer0) | Rom Fuse [1] (Layer1) | Rom Fuse [2] (Layer2) | Rom Fuse [3] (Layer3) |
| 0(good) or 1(fail) | 0(good) or 1(fail) | 0(good) or 1(fail) | 0(good) or 1(fail) |

FIG. 4

THREE DIMENSIONALLY STACKED MEMORY AND THE ISOLATION OF MEMORY CELL LAYER

CROSS-REFERENCE TO RELATED APPLICATION

This application is based upon and claims the benefit of priority from prior Japanese Patent Application No. 2008-16252, filed on Jan. 28, 2008, the entire contents of which are incorporated herein by reference.

BACKGROUND OF THE INVENTION

1. Field of the Invention

The present invention relates to a semiconductor memory device.

2. Background Art

Currently, in a flash memory device, a redundant block is used to replace a defective block. However, if the number of defective blocks found in a memory chip is equal to or greater than a predetermined number at shipping inspection, the memory chip is identified as a defective chip.

Japanese Patent Laid-Open No. 1997-146849 discloses a memory reconstruction method for improving the system reliability by isolating a memory in which a fault occurs.

Recently, a flash memory device having a large capacity has been advancing, and in order to meet the needs of further large capacity and reduced area on a planar surface, there has been known a three dimensionally stacked NAND flash memory including a plurality of layers, each of which has a memory cell array, (hereinafter referred to as a memory cell layer) laminated in one chip.

SUMMARY OF THE INVENTION

An embodiment of the present invention provides a semiconductor memory device characterized by including:

a stacked memory cell array having a laminated plurality of memory cell layers, wherein each of the individual memory cell layers has a plurality of blocks;

a layer quality information storing circuit which can store layer quality information indicating whether the individual memory cell layer is a normal memory cell layer or a defective memory cell layer so as to identify a memory cell layer in which the number of defective blocks found is equal to or greater than a predetermined number as a defective memory cell layer and the other memory cell layers as normal memory cell layers; and an address converting circuit in which if an externally input address input from outside corresponds to the block in the defective memory cell layer, the externally input address is address-converted so as to correspond to the block of the normal memory cell layer.

BRIEF DESCRIPTION OF THE DRAWINGS

FIG. 3A is a drawing showing an address table before address conversion;

FIG. 3B is a drawing showing an address table after address conversion;

FIG. 4 is a drawing showing a configuration of Rom Fuse;

DESCRIPTION OF THE EMBODIMENTS

Before embodiments of the present invention are described, the background in which the present inventor has reached the present invention will be described.

Figure 14:
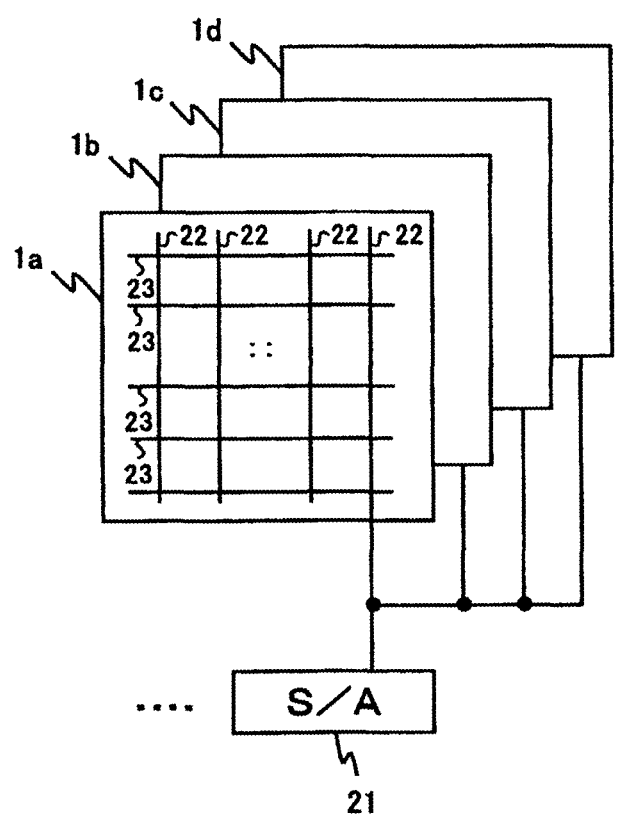
FIG. 14 is a drawing showing a configuration of a three dimensionally stacked NAND flash memory.

FIG. 14 shows a configuration of a three dimensionally stacked NAND flash memory having a plurality of memory cell layers 1a, 1b, 1c, and 1d, and a sense amplifier 21. Each of the memory cell layers 1a, 1b, 1c, and 1d has a memory transistor (not shown) located at an intersection of a bit line 22 and a word line 23. A predetermined number of memory transistors are grouped into a memory unit. A collective erasure can be performed in units of memory units. The sense amplifier 21 detects a very small amount of potential change based on an on or off state of a memory cell to read from and determines the read data. The sense amplifier 21 is provided common to the corresponding bit lines of the memory cell layers 1a, 1b, 1c, and 1d in FIG. 14 and is configured to be switched by a switch (not shown).

A case is considered in which an inspection is performed on such a three dimensionally stacked NAND flash memory in the same manner as before. If the number of defective memory transistors found in an individual block is equal to or greater than a predetermined number, the block is identified as a defective block. If the number of defective blocks found in one or two or more memory cell layers is equal to or greater than a predetermined number (acceptable value n), the memory cell layer is identified as defective. If at least one defective memory cell layer is found in one chip, the chip is identified as a defective chip, even though the other memory cell layers are normal. Thereby, reduction of yield cannot be prevented.

In a process of sequentially forming a plurality of memory cell layers in one chip, an element in a lower memory cell layer may undergo heat treatment more than before as an upper memory cell layer is formed. Therefore, there is a high possibility of reducing yield. For example, with reference to a three dimensionally stacked NAND flash memory in FIG. 14, if the memory cell layers are formed in the order of 1a, 1b, 1c, and 1d, the memory cell layer 1a undergoes heat treatment when the memory cell layers 1b, 1c, and id are formed. Moreover, on the contrary, if a fabrication condition and the like are changed in a middle of the process, there is also a possibility of reducing yield of the upper memory cell layers. In the above example, it is considered that the yield of the memory cell layer 1d is relatively reduced.

The above technical problem is not yet recognized by other skilled in the art, but is recognized uniquely by the present inventors. The present inventors consider the problem in the following way.

A case is considered in which an inspection of the individual memory cell layers (1a, 1b, 1c, and 1d) reveals that many defective blocks are found in the memory cell layers 1a and 1c, and the number of defective blocks exceeds the acceptable value. In this case, with the conventional test, the entire chip is identified as defective even if there is no defective block in the memory cell layers 1b and 1d. However, the distribution of the defective blocks depends on the memory cell layer, and thus half the memory cell layers can be used as a memory device by excluding the memory cell layers in which many defective blocks are found. For example, an ID code for identifying the capacity can be written in a nonvolatile memory used as a management area so that the device can be used as a memory device having a specific capacity from outside.

The present invention intends to provide what has been described as above.

Hereinafter, embodiments of the present invention will be described with reference to drawings.

In the first embodiment, a logical isolation (meaning an exclusion from a logical address) is performed on a defective memory cell layer by performing address conversion using a circuit inside the flash memory chip. In the second to fourth embodiments, a defective memory cell layer is isolated using a host controller outside the flash memory chip.

First Embodiment

Figure 1:
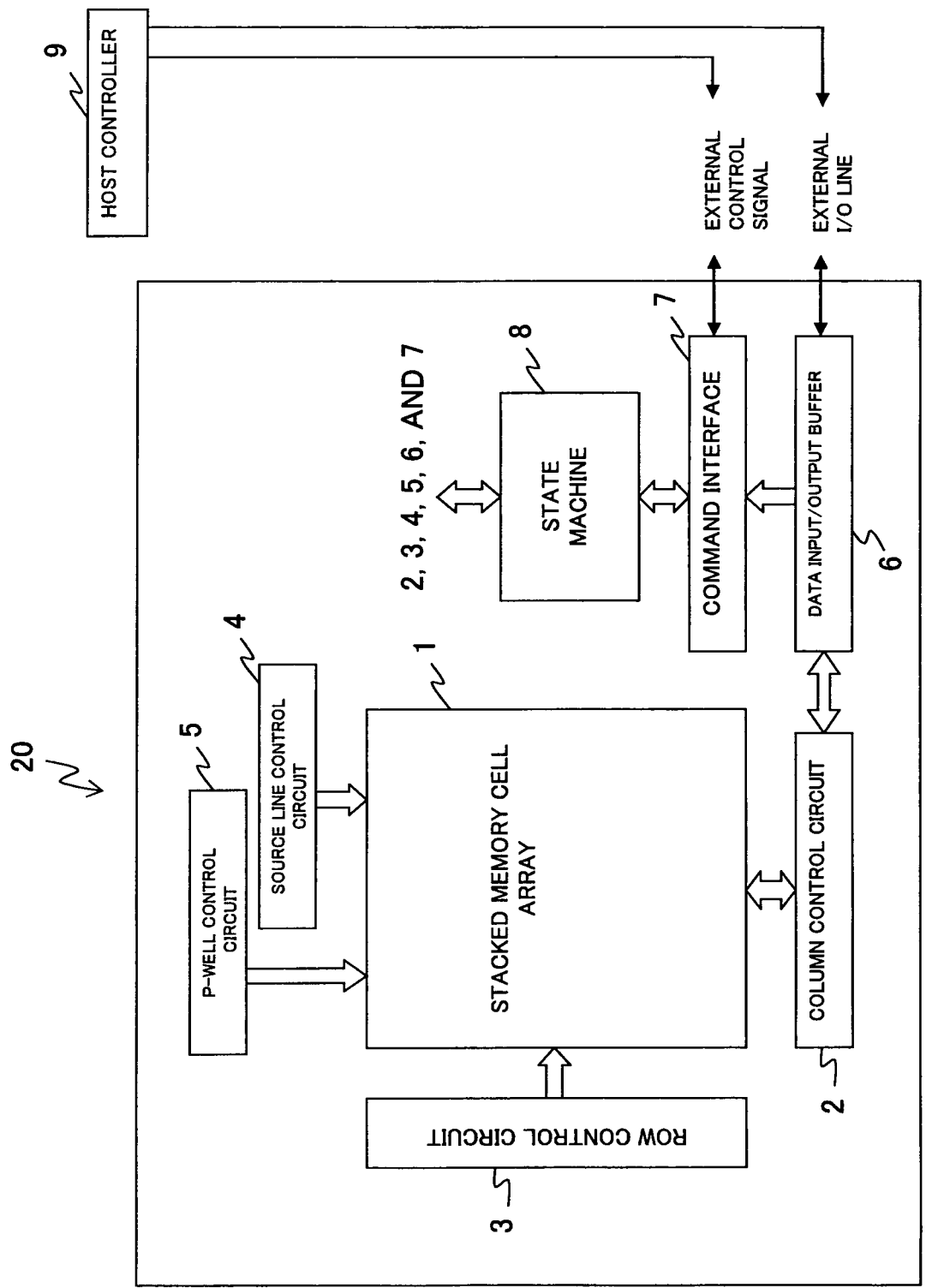
FIG. 1 is a drawing showing an entire configuration of a flash memory device.

FIG. 1 shows an entire configuration of a flash memory device in accordance with a first embodiment. The flash memory device has a host controller 9 and a flash memory chip 20. The flash memory chip 20 has a stacked memory cell array 1, a column control circuit 2, a row control circuit 3, a source line control circuit 4, a P-well control circuit 5, a data input/output buffer 6, a command interface 7, and a state machine 8. The individual components will be described.

The stacked memory cell array 1 has a plurality of memory cell layers configured such that the memory cells of the flash memory are arranged in a matrix.

The column control circuit 2 (column decoder) is provided adjacent to the stacked memory cell array 1. The column control circuit 2 controls a bit line of the stacked memory cell array 1 to erase data of a memory cell, write data in the memory cell, and read data from the memory cell. It should be noted that the column control circuit 2 may be provided for each memory cell layer, or may be provided common to a plurality of memory cell layers to reduce the chip area.

The row control circuit 3 (row decoder) is provided adjacent to the stacked memory cell array 1. The row control circuit 3 selects a word line of the stacked memory cell array 1 and applies a voltage required to erase data of, write data in, and read data from the memory cell. It should be noted that the row control circuit 3 may be provided for each memory cell layer, or may be provided common to a plurality of memory cell layers to reduce the chip area.

Moreover, the source line control circuit 4 for controlling a source line of the stacked memory cell array 1, and the P-well control circuit 5 for controlling the potential of a P-well in which the stacked memory cell array 1 is formed are provided.

The data input/output buffer 6 is connected to an external host controller 9 through an external I/O line to receive write data, send read data, and receive address data and command data. Moreover, the data input/output buffer 6 sends write data received from the host controller 9 to the column control circuit 2; and in reverse, receives data read from the column control circuit 2. At this time, in order to select a memory cell to write in or read from, the data input/output buffer 6 sends address data received from the host controller 9 to the column control circuit 2 and the row control circuit 3 through the state machine 8; and sends command data received from the host controller 9 to the command interface 7.

The command interface 7 receives an external control signal from the host controller 9 and determines the type of the data (write data, command data, or address data) input to the data input/output buffer 6. If the data is command data, the signal is transferred as a receive command signal to the state machine 8.

The state machine 8 performs an entire management of the flash memory chip 20 by receiving a command from the host controller 9, reading data, writing data, erasing data, and performing data I/O management.

The host controller 9 controls the flash memory chip 20 with external control signals (read, write, erase, and the like).

Figure 2A:
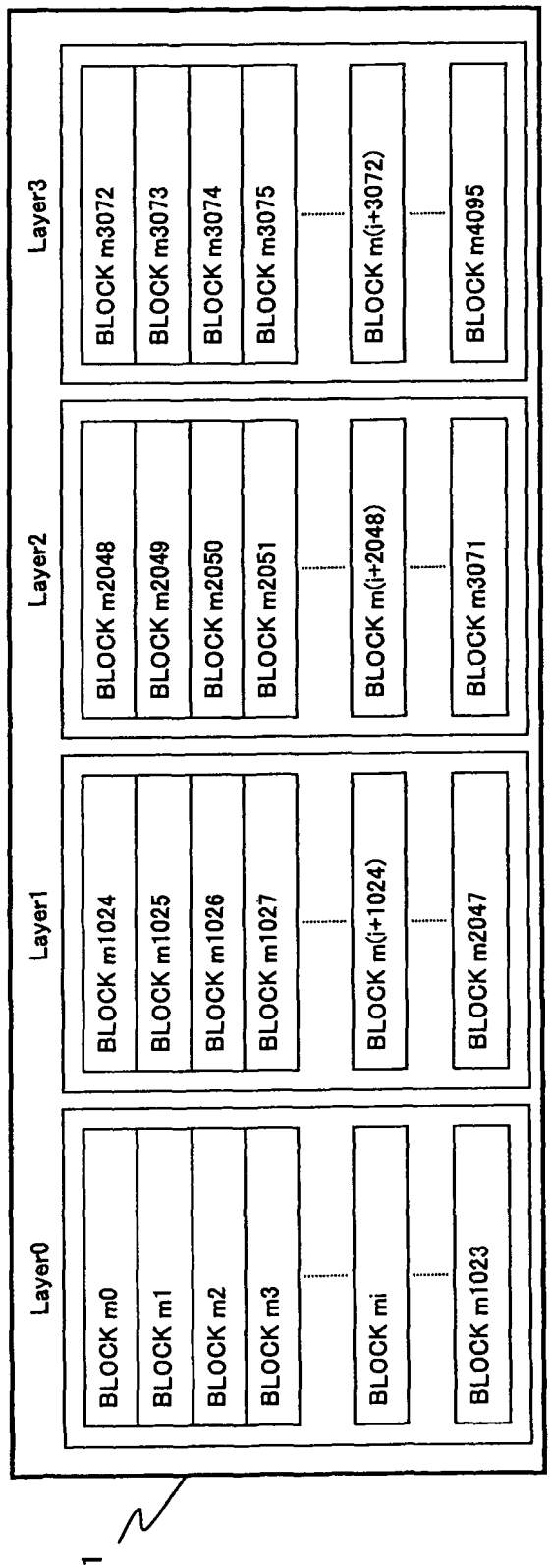
FIG. 2A is a drawing showing a configuration of a stacked memory cell array.

FIG. 2A shows a configuration of the stacked memory cell array 1. According to the present embodiment, the stacked memory cell array 1 is configured to stack four memory cell layers. Each of the layers (Layer 0 to 3) consists of 1024 blocks, and the entire layers consist of a total of 4096 blocks. It should be noted that a block is a minimum unit of data erasing.

Figure 2B:
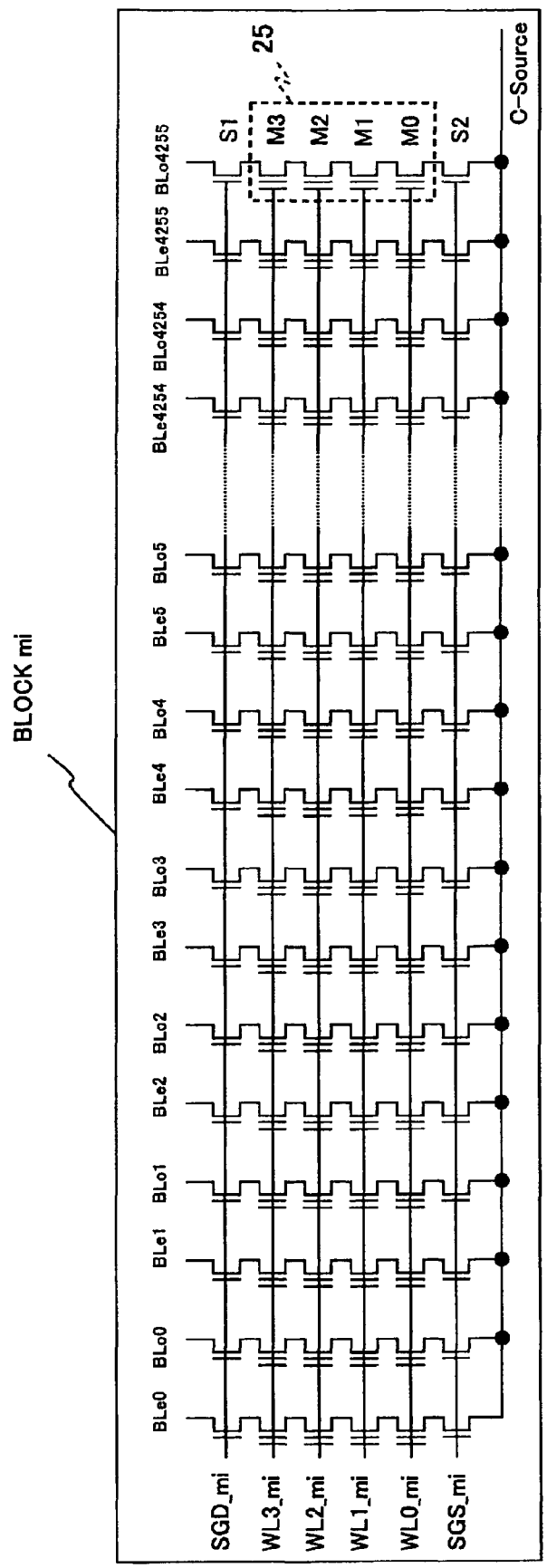
FIG. 2B is a drawing showing a configuration of individual blocks (BLOCKmi)

FIG. 2B shows a configuration of individual blocks (BLOCKmi). As understood from FIG. 2B, one block consists of 8512 NAND memory units 25. Each NAND memory unit 25 is configured by connecting four memory cells M0 to M3 in series. Each of the memory cells M0 to M3 is a nonvolatile storage element, for example, an n-MOS transistor in which a floating gate for accumulating electrons is buried in a gate oxide film. One end of the individual NAND memory unit 25 is connected to each of the bit lines BL (BLe 0 to BLe 4255 and BLo 0 to BLo 4255) through a selection gate S1 in which a selection gate line SGD_mi is connected to the control gate. The other end thereof is connected to a common source line C-source through a selection gate S2 in which a selection gate line SGS_mi is connected to a control gate. The control gate of each of the memory cells M0 to M3 is connected to a respective one of the word lines WL (WL0_mi to WL3_mi). The even-numbered bit lines BLe and the odd-numbered bit lines BLo starting at 0 are independent from each other such that data is written in and read from separately. Data writing or reading is simultaneously performed on the 4256 memory cells connected to the even-numbered bit lines BLe of the 8512 memory cells connected to one word line WL. An individual memory cell stores one bit of data, and 4256 memory cells constitute a unit known as page. If one memory cell stores two bits of data, 4256 memory cells store two pages of data. In this case, in the same manner as for the even-numbered bit lines BLe, the 4256 memory cells connected to odd-numbered bit lines BLo constitute another two pages, and data writing or reading is simultaneously performed on an individual memory cell in a page.

If the number of defective NAND memory units 25 found in a block is equal to or greater than a predetermined number, the block is identified as a defective block.

Next, the capacity of the memory device will be described in detail. If the blocks in all the memory cell layers are normal, the capacity of the memory device is calculated by 4 layers (Layer 0 to 3)×1024 blocks×4 pages×4256 columns×2 (Even/Odd)=approximately 140M bits.

On the contrary, for example, if memory cell layers 1 and 3 are determined as defective, the memory cell layers 1 and 3 are isolated. Then, the capacity is calculated by 2 layers (Layers 0, 2)×1024 blocks×4 pages×4256 columns×2 (Even/Odd)=approximately 70M bits.

It should be noted that according to the present embodiment, one memory cell layer is composed of 1024 blocks, one block has 8512 NAND memory units 25, and one NAND memory unit 25 has four memory cells, but the present invention is not limited to this. The number of blocks, NAND memory units, and memory cells can be modified according to a desired capacity.

Next, a method of isolating a memory cell layer (defective memory cell layer) in which many defective blocks are found will be described. There are a logical isolation (address conversion) and a physical isolation as the method of isolating the memory cell layer. First, the logical isolation is described, and then, the physical isolation is described.

First, the method of logically isolating a defective memory cell layer will be described in detail. A case is considered in which a test of individual memory cell layers (Layer 0 to 3) reveals that many defective blocks are found in Layers 1 and 3, and the number of defective blocks exceeds the acceptable value "n". FIG. 3A shows an address table of memory cells before address conversion and FIG. 3B shows an address table of memory cells after address conversion respectively.

As understood from FIG. 3B, the blocks 1024 to 2047 and the blocks 3072 to 4095 corresponding to the memory cell layers 1 and 3 respectively cannot be seen from an external host controller, and the blocks 2048 to 3071 of the memory cell layer 2 are converted to blocks 1024 to 2047. At this time, as described above, the capacity of the memory device is reduced to 70M bits, or half the capacity thereof in comparison with the memory device free from defective memory cell layers.

It should be noted that the acceptable value "n" used as the basis of quality determination of a memory cell layer can be set to any integer 0<n<1023.

Next, the method of converting a memory address will be described in detail.

FIG. 4 shows a configuration of a Rom Fuse for storing a test result of a memory cell layer. As understood from FIG. 4, since the memory cell layer of the present embodiment has four layers (Layers 0 to 3), the Rom Fuse is 4 bits of memory. The Rom Fuse uses part of the non-volatile memory region. It should be noted that information stored in the Rom Fuse may be read at the time of power on, copied in a register, and subsequently read from the register.

The Rom Fuses [0] to [3] store quality information about individual memory cell layers (Layer 0 to 3). More specifically, "0" is stored for a normal layer (good), and "1" is stored for a defective layer (fail). On the contrary, "1" may be stored for a normal layer (good), and "0" may be stored for a defective layer (fail).

Next, the content of an address conversion will be described for each generation pattern of a defective memory cell layer.

If Rom Fuse [3:0]=[0, 0, 0, 0], which means there is no defective memory cell layer, no address conversion is performed.

Figure 5:
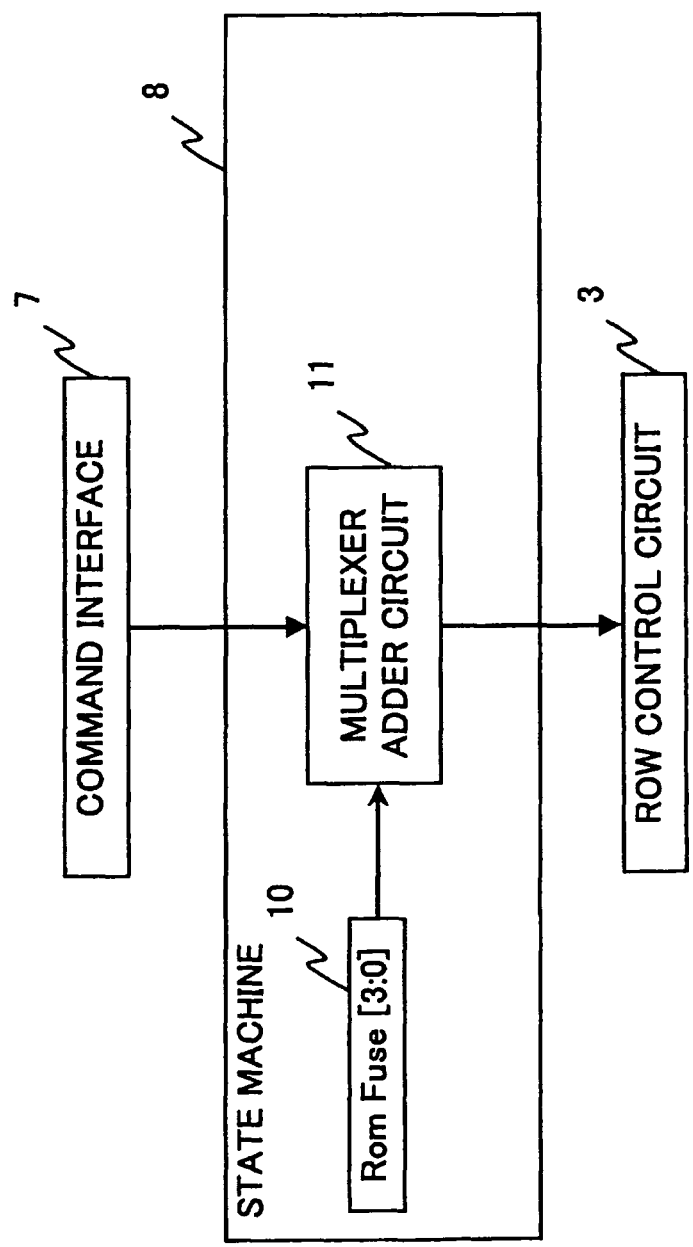
FIG. 5 is a drawing showing an operation of the address conversion in accordance with a first embodiment.

If Rom Fuse [3:0]=[0, 0, 0, 1], Layer 0 is recognized as defective, and Layer 0 is logically isolated. At this time, the address adding 1024 to an address input from outside is used as the address inside the device. The operation is described in detail with reference to FIG. 5. Address information is transferred to the state machine 8 from the external host controller 9 through the command interface 7 and the data input/output buffer 6. Afterward, the multiplexer adder circuit 11 in the state machine 8 is used to add 1024 to the transferred address information. Then, the address information generated in this manner is transferred to the row control circuit 3 and the row control circuit 3 accesses the block indicated by the generated address. Here, the multiplexer adder circuit 11 can also function as a multiplexer circuit and can add an arbitrary value based on the information in the Rom Fuse (Rom Fuse [3:0]) 10 (including not to convert the address).

If Rom Fuse [3:0]=[0, 0, 1, 0], Layer 1 is recognized as defective, and Layer 1 is logically isolated. In this case, when the externally input address is equal to or less than 1023, the multiplexer adder circuit 11 transfers the address as is to the row control circuit 3 and when the externally input address is equal to or greater than 1024, the multiplexer adder circuit 11 adds 1024 thereto and transfers the address to the row control circuit 3; and the row control circuit 3 uses the transferred address to access the block.

If Rom Fuse [3:0]=[0, 1, 0, 0], Layer 2 is recognized as defective, and Layer 2 is logically isolated. In this case, when the externally input address is equal to or less than 2047, the multiplexer adder circuit 11 transfers the address as is to the row control circuit 3; when the externally input address is equal to or greater than 2048, the multiplexer adder circuit 11 adds 1024 thereto and transfers the address to the row control circuit 3; and the row control circuit 3 uses the transferred address to access the block.

If Rom Fuse [3:0]=[1, 0, 0, 0], Layer 3 is recognized as defective, and Layer 3 is logically isolated. In this case, the multiplexer adder circuit 11 does not perform address conversion.

If Rom Fuse [3:0]=[0, 0, 1, 1], Layers 0, 1 are recognized as defective, and Layers 0, 1 are logically isolated. In this case, the multiplexer adder circuit 11 adds 2048 to an externally input address and transfers the address to the row control circuit 3; and the row control circuit 3 uses the transferred address to access the block.

If Rom Fuse [3:0]=[0, 1, 0, 1], Layers 0, 2 are recognized as defective, and Layers 0, 2 are logically isolated. In this case, when the externally input address is equal to or less than 1023, the multiplexer adder circuit 11 adds 1024 thereto and transfers the address to the row control circuit 3; when the externally input address is equal to or greater than 1024, the multiplexer adder circuit 11 adds 2048 thereto and transfers the address to the row control circuit 3; and the row control circuit 3 uses the transferred address to access the block.

If Rom Fuse [3:0]=[1, 0, 0, 1], Layers 0, 3 are recognized as defective, and Layers 0, 3 are logically isolated. In this case, the multiplexer adder circuit 11 adds 1024 to an externally input address and transfers the address to the row control circuit 3; and the row control circuit 3 uses the transferred address to access the block.

If Rom Fuse [3:0]=[0, 1, 1, 0], Layers 1, 2 are recognized as defective, and Layers 1, 2 are logically isolated. In this case, when the externally input address is equal to or less than 1023, the multiplexer adder circuit 11 transfers the address as is to the row control circuit 3, and when the externally input address is equal to or greater than 1024, the multiplexer adder circuit 11 adds 2048 thereto and transfers the address to the row control circuit 3; and the row control circuit 3 uses the transferred address to access the block.

If Rom Fuse [3:0]=[1, 0, 1, 0], Layers 1, 3 are recognized as defective, and Layers 1, 3 are logically isolated. In this case, when the externally input address is equal to or less than 1023, the multiplexer adder circuit 11 transfers the address as is to the row control circuit 3; when the externally input address is equal to or greater than 1024, the multiplexer adder circuit 11 adds 1024 thereto and transfers the address to the row control circuit 3; and the row control circuit 3 uses the transferred address to access the block.

If Rom Fuse [3:0]=[1, 1, 0, 0], Layers 2, 3 are recognized as defective, and Layers 2, 3 are logically isolated. In this case, the multiplexer adder circuit 11 does not perform address conversion.

If Rom Fuse [3:0]=[0, 1, 1, 1], Layers 0, 1, 2 are recognized as defective, and Layers 0, 1, 2 are logically isolated. In this case, the multiplexer adder circuit 11 adds 3072 to an externally input address and transfers the address to the row control circuit 3; and the row control circuit 3 uses the transferred address to access the block.

If Rom Fuse [3:0]=[1, 0, 1, 1], Layers 0, 1, 3 are recognized as defective, and Layers 0, 1, 3 are logically isolated. In this case, the multiplexer adder circuit 11 adds 2048 to an externally input address and transfers the address to the row control circuit 3; and the row control circuit 3 uses the transferred address to access the block.

If Rom Fuse [3:0]=[1, 1, 0, 1], Layers 0, 2, 3 are recognized as defective, and Layers 0, 2, 3 are logically isolated. In this case, the multiplexer adder circuit 11 adds 1024 to an externally input address and transfers the address to the row control circuit 3; and the row control circuit 3 uses the transferred address to access the block.

If Rom Fuse [3:0]=[1, 1, 1, 0], Layers 1, 2, 3 are recognized as defective, and Layers 1, 2, 3 are logically isolated. In this case, the multiplexer adder circuit 11 does not perform address conversion.

As described above, address conversion can be performed on any defective pattern according to the information of Rom Fuse [3:0] to logically isolate a defective memory cell layer.

Next, the method of physically isolating a defective memory cell layer will be described.

Since a short circuit or the like occurs in a defective block in a defective memory cell layer, test puts unnecessary stress on the word lines WL and the like, thereby increasing current. Moreover, even if a block in the defective memory cell layer is determined as a normal block at inspection, the block may potentially be a defective block. Therefore, it is preferable to physically isolate all the blocks in the defective memory cell layer.

Hereinafter, a detailed description will be given with reference to FIGS. 6 to 8. First, physical isolation of one block is described.

Figure 6:
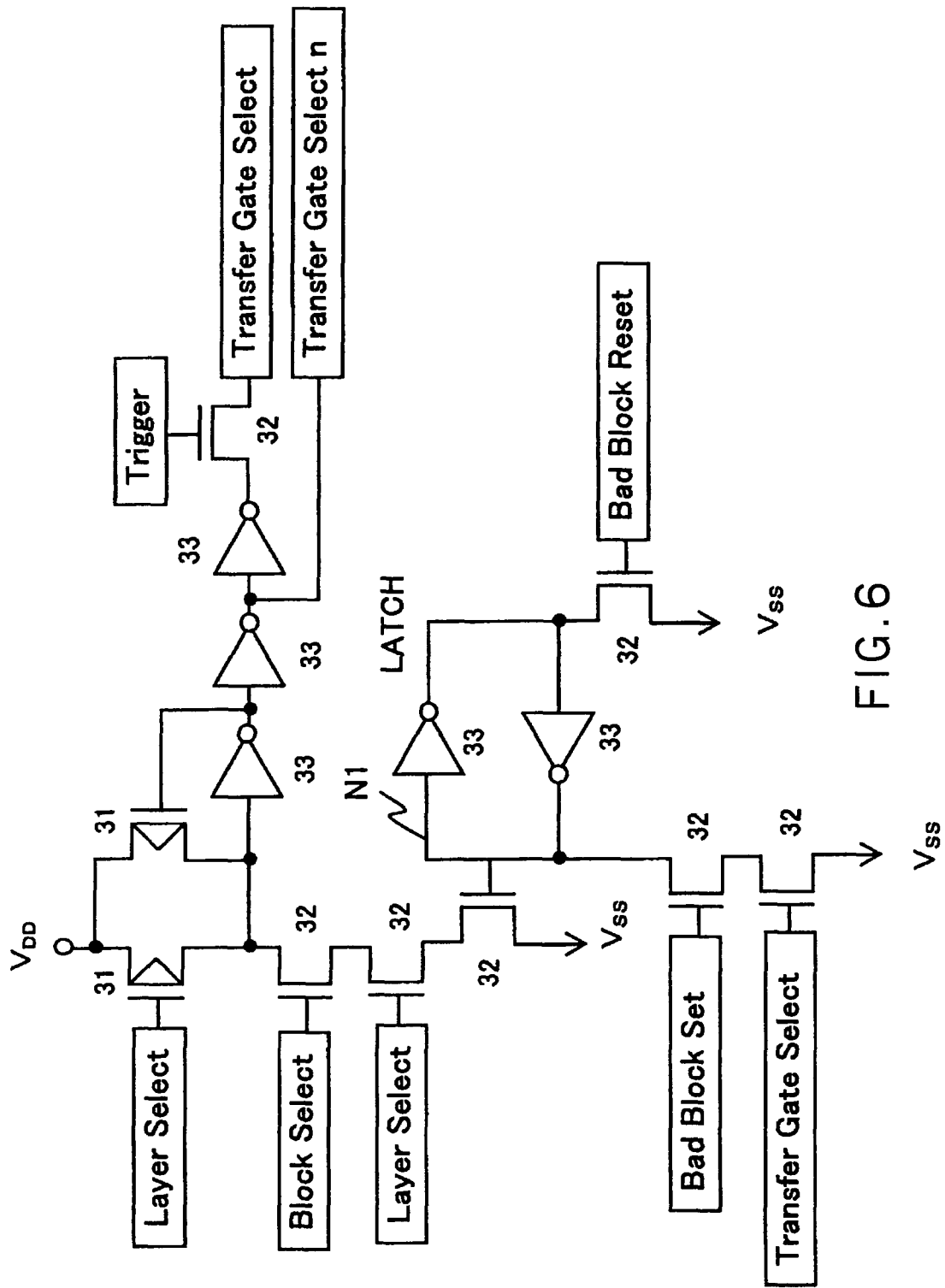
FIG. 6 is a drawing showing a circuit of a block decoder.
Figure 7:
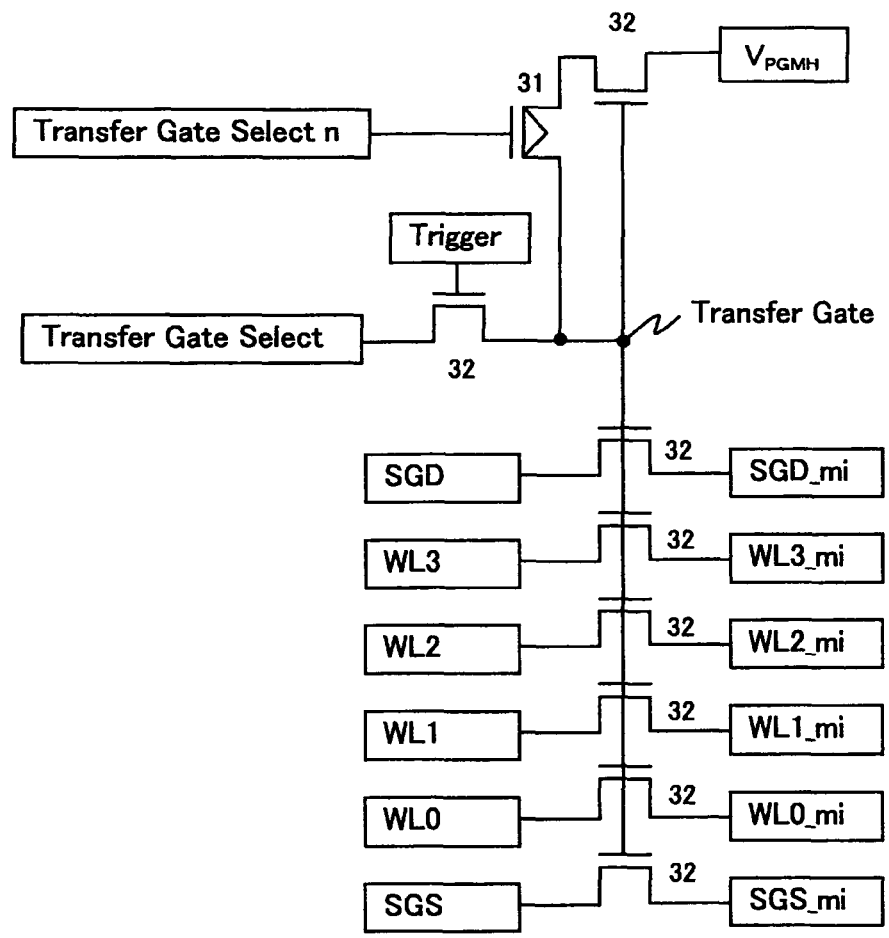
FIG. 7 is a drawing showing a transfer gate section.

FIG. 6 shows a circuit diagram of a block decoder. The block decoder is located in the row control circuit 3, and is provided for each block. As described above, when an address input from the external host controller is transferred to the row control circuit 3, a block corresponding to the address is selected. When the block is selected, the layer selection terminal (Layer Select) and the block selection terminal (Block Select) are selected ($V_{DD}$). If the block indicated by the selected address is normal, node N1 in the block decoder is "$V_{DD}$". In this state, when the trigger terminal (Trigger) is turned on, the transfer gate selection terminal (Transfer Gate Select) becomes "$V_{DD}$", and the transfer gate selection terminal "n" (Transfer Gate Select n) becomes "$V_{ss}$". Then, these signals are transferred to the circuit shown in FIG. 7. Thereby, the transfer gate section (Transfer Gate) becomes high voltage "$V_{PGMH}$". As a result, the voltage "$V_{PGM}$" can be transferred to the selection gate (SGD_mi and SGS_mi) and the word lines WL (WL0_mi to WL3_mi) of the selected block BLOCKmi. That is, the circuit shown in FIG. 7 operates like a local pump. Here, "$V_{PGMH}$" is greater than "$V_{PGM}$".

Next, a case in which the selected block is a defective block is described. In this case, as described later, the defective block set terminal (Bad Block Set) is set and the node N1 of FIG. 6 becomes "$V_{ss}$", and thus, the transfer gate selection terminal (Transfer Gate Select) becomes "$V_{ss}$", and the transfer gate selection terminal "n" (Transfer Gate Select n) becomes "$V_{DD}$". Therefore, the transfer gate section (Transfer Gate) of FIG. 7 does not become high voltage "$V_{PGMH}$" and no voltage is transferred to the selection gate or the word lines WL of the selected block.

Next, physical isolation of a defective memory cell layer is described. The above described Rom Fuse [3:0] is used to physically isolate all the blocks in the defective memory cell layer.

Figure 8:
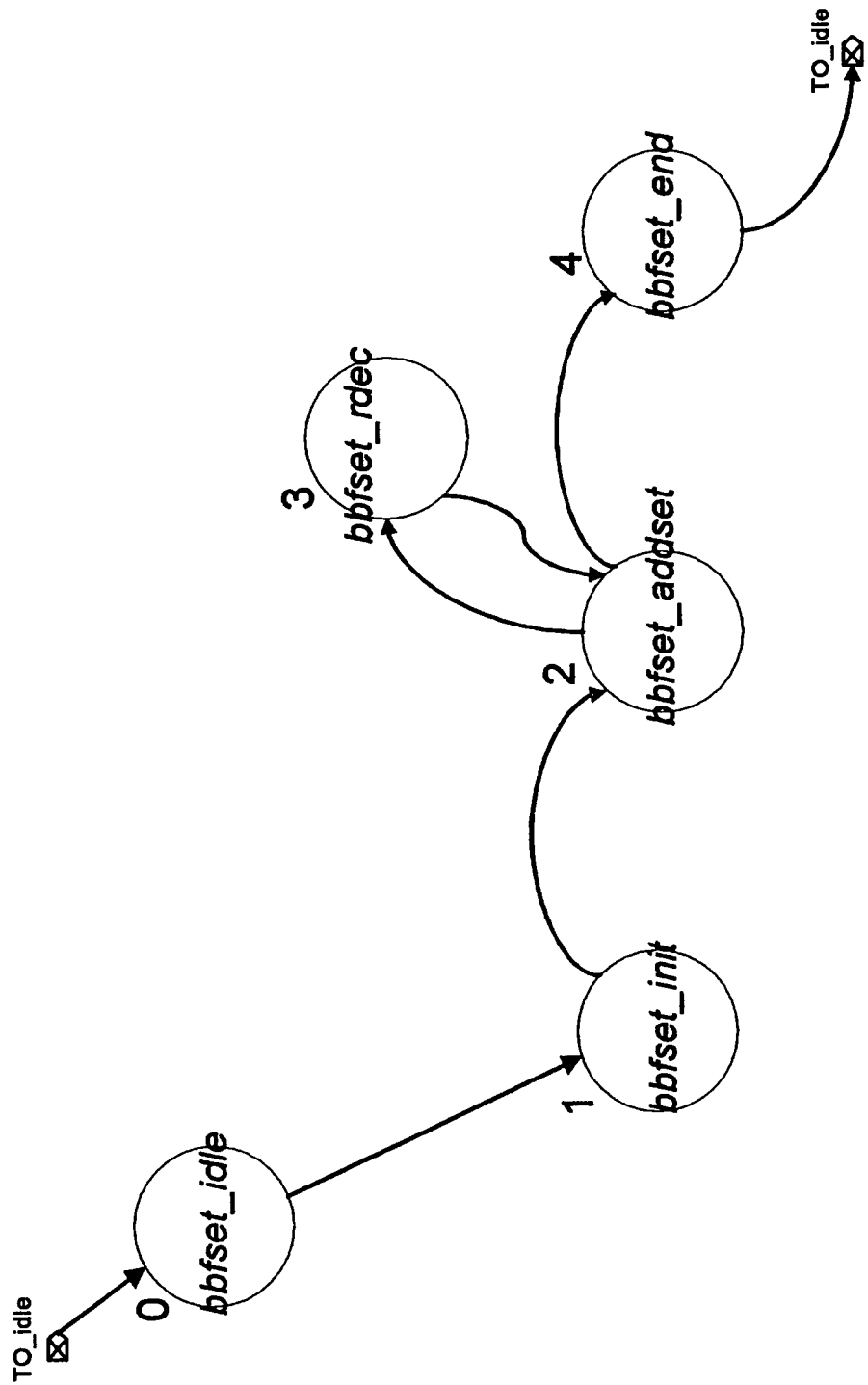
FIG. 8 is a state transition diagram showing an operation of physical isolation of a block.

FIG. 8 shows a state transition diagram of a case of physically isolating a defective memory cell layer. The state 0 (bbfset_idle) indicates an idle state. In the state 1 (bbfset_init), circuit setting and initial reset operation are performed. Next, in the state 2 (bbfset_addset), address setting is performed based on the information of the defective memory cell layer of Rom Fuse [3:0]. At this time, address setting is performed in the same manner as for the above described address conversion by the state machine 8, and the set address is transferred to the row control circuit 3. The circuit performing the operation of the state 2 creates an address and includes an adder circuit. Next, in the state 3 (bbfset_rdec), the address transferred from the state machine 8 to the row control circuit 3 is used to perform physical isolation on the block indicated by the address. The physical isolation is performed by setting the defective block set terminal (Bad Block Set) of FIG. 6. First, when the address is selected, the block selection terminal (Block Select) and the layer selection terminal (Layer Select) of the selected block are set, and the transfer gate selection terminal (Transfer Gate Select) is set. Then, in this state, when the defective block set terminal (Bad Block Set) is set, the node N1 of FIG. 6 becomes "$V_{ss}$", and the latch is inverted. The subsequent operation is the same as described above, and no voltage is transferred to the selection gate or the word lines WL of the selected block. The physical isolation is achieved in this manner.

The address setting in the state 2 and the physical isolation in the state 3 described above are repeatedly performed on all the blocks of the defective memory cell layer. Thereby, the defective memory cell layer can be physically isolated in a self-test mode and in a batch. Here, "in a self-test mode" means that the flash memory chip 20 performs the above operation without being affected by an external control such as the host controller 9.

Further, the above isolation operation is described using examples.

For example, if Rom Fuse [3:0]=[0, 1, 0, 1], Layers 0, 2 need be physically isolated. Here, first, the block 0 is set by address setting in the state 2, and then, physical isolation is performed on the block 0 in the state 3. Subsequently, physical isolation is performed in series by incrementing the address by one. When physical isolation is performed on the block 1023, namely, the last block of the Layer 0, the physical isolation for all the blocks in the Layer 0 is completed. Then, in the next address setting in the state 2, the first block 2048 in the Layer 2 is set. In the same manner, physical isolation is performed on up to the block 3071, and the physical isolation for all the blocks in the Layer 2 is completed. Then, the state moves to the end of state transition, namely, the state 4 (bbfset_end), and the physical isolation operation of the defective memory cell layer is completed.

In the same manner, physical isolation can be performed on the other combination of defective memory cell layers.

Moreover, the block selection terminal (Block Select) and the layer selection terminal (Layer Select) corresponding to the defective block are configured to be able to be selected in a batch, and then, the defective memory cell layers can be physically isolated in a batch by setting the defective block setting terminal (Bad Block Set).

Next, another method of physically isolating a defective memory cell layer will be described. According to the method, an individual memory cell layer has one layer selection terminal (Layer Select), namely, Layer Select [3:0] and the Layer Select [3:0] is configured not to be set to the defective memory cell layer. More specifically, configuration is made such that when the value of the element corresponding to the Rom Fuse [3:0] is 1 (Fail), the value of the element corresponding to the Layer Select [3:0] is set to 0. On the contrary, configuration is made such that when the value of the element corresponding to the Rom Fuse [3:0] is 0 (good), the value of the element corresponding to the Layer Select [3:0] is set to 1.

Figure 9:
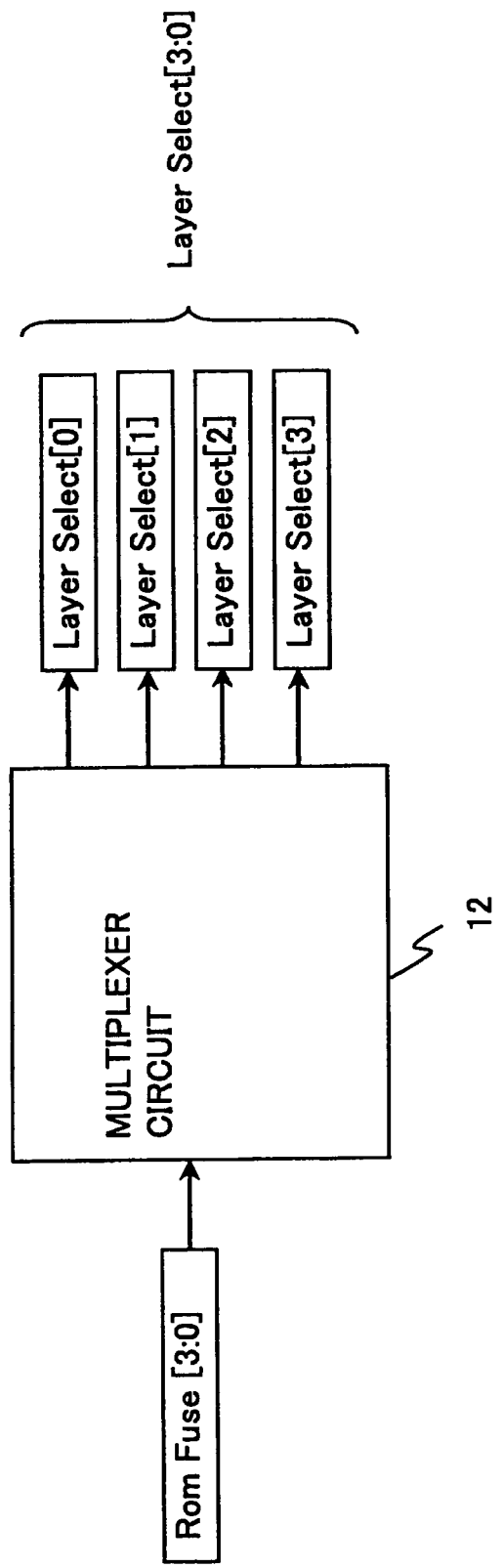
FIG. 9 is a drawing showing that layer selection signals (Layer Select [0] to [3]) are generated by a multiplexer circuit.

A further detailed description will be given using FIG. 9. FIG. 9 shows a method of generating the Layer Select [3:0] based on the above Rom Fuse [3:0] using the multiplexer circuit 12. The multiplexer circuit 12 receives the Rom Fuse [3:0] as an input signal, and outputs the value with the corresponding element inverted as signals Layer Select [0] to Layer Select [3] of the individual memory cell layers. When the Layer Select [i] signal (i=0 to 3) becomes 0, the layer selection terminals (Layer Select) of all the blocks in the corresponding defective memory cell layer becomes "$V_{ss}$". As a result, the transfer gate selection terminal (Transfer Gate Select) is not set, and thus the defective memory cell layer is always physically isolated.

This method does not need to set the defective block setting terminal (Bad Block Set), and thus can physically isolate the defective memory cell layers at a higher speed and in a batch.

Figure 10:
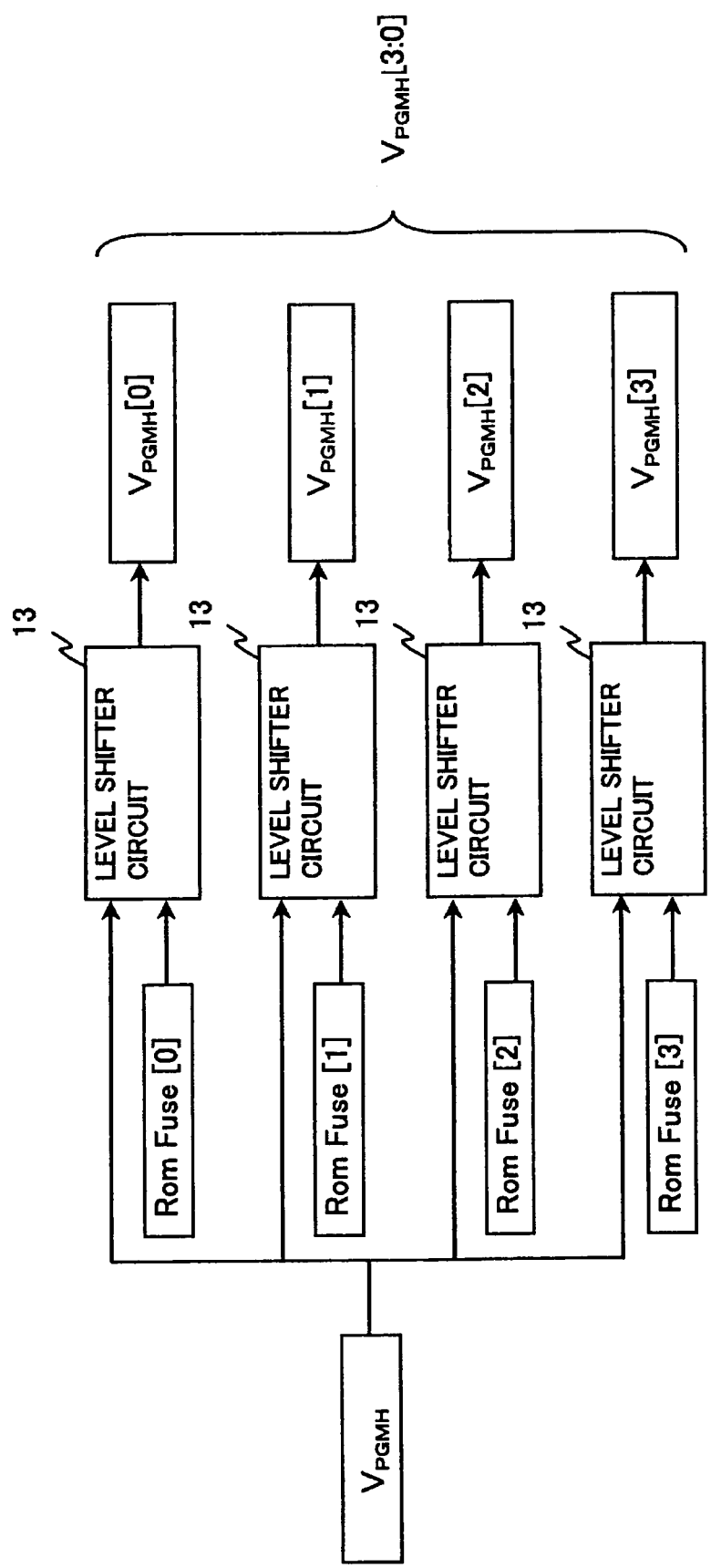
FIG. 10 is a drawing showing that a $V_{PGMH}$ signal is generated by a level shifter circuit.

Next, still another method of physically isolating a defective memory cell layer will be described. The method provides high voltage "$V_{PGMH}$" of FIG. 7 for each memory cell layer, namely, in the form of $V_{PGMH}$ [3:0], so as not to allow the corresponding element to be set by a defective memory cell layer. Further detail is described using FIG. 10. FIG. 10 shows a method of converting one $V_{PGMH}$ to $V_{PGMH}$ [i] (i=0 to 3) for each memory cell layer using the level shifter circuit 13. The high voltage "$V_{PGMH}$" generated by the row control circuit 3 is distributed to $V_{PGMH}$ [3:0] by the level shifter circuits 13 which receive Rom Fuse [3:0] as input signals. More specifically, if the value of Rom Fuse [i] is 1 (defective memory cell layer), high voltage is not transferred to the corresponding $V_{PGMH}$ [i]; and on the contrary, if the value of Rom Fuse [i] is 0 (normal memory cell layer), high voltage is transferred to the corresponding $V_{PGMH}$ [i].

Figure 11:
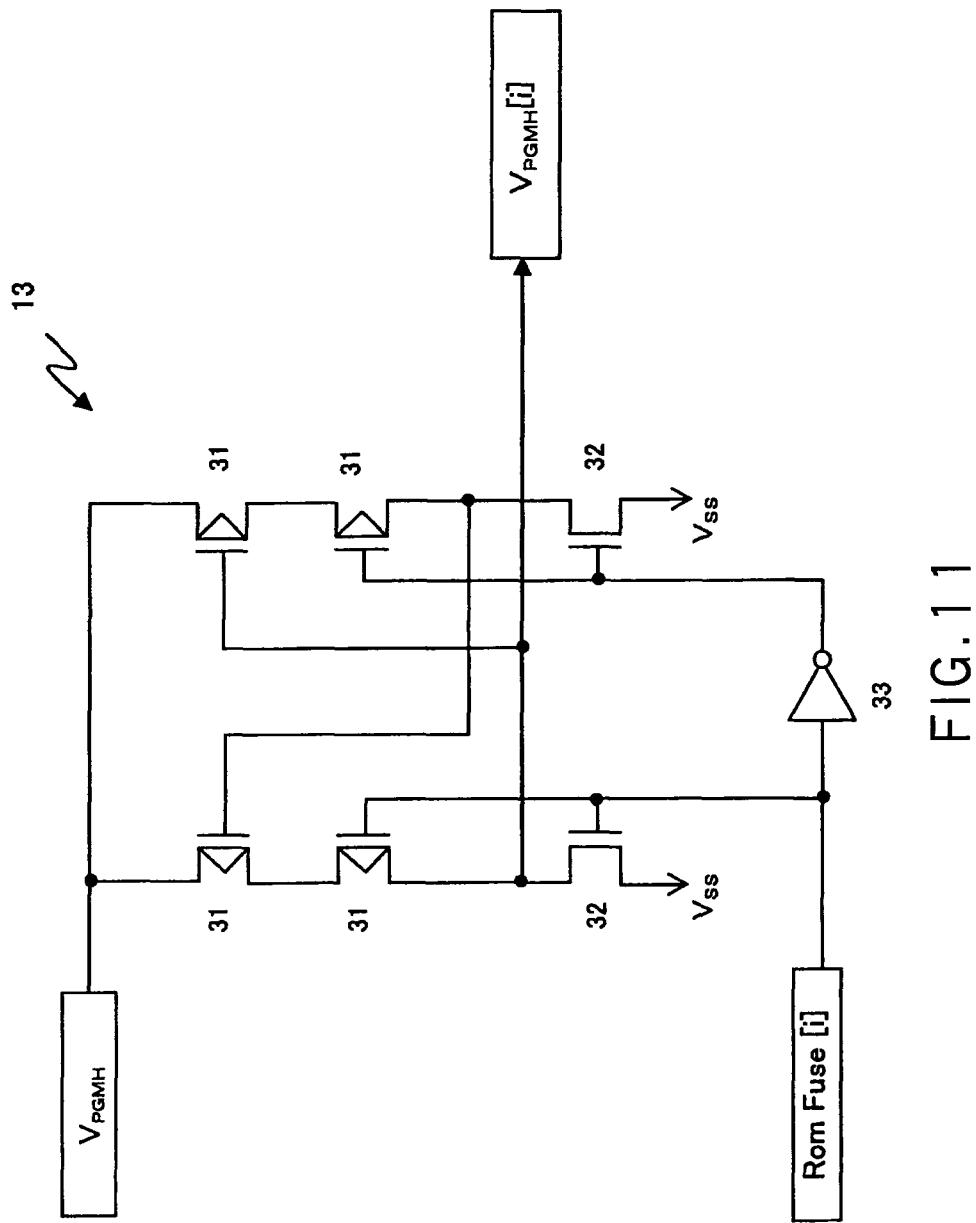
FIG. 11 is a drawing showing an equivalent circuit of the level shifter circuit of FIG. 10.

FIG. 11 shows an equivalent circuit of the level shifter circuit 13 to be used at this time. The value of an input signal Rom Fuse [i] determines whether to transfer high voltage to $V_{PGMH}$ [i].

The method prevents high voltage $V_{PGMH}$ to be transferred to the transfer gate section (Transfer Gate) of the defective memory cell layer and allows physical isolation to be performed.

The method eliminates the need to set the defective block setting terminal (Bad Block Set) and can physically isolate the defective memory cell layers at a higher speed and in a batch.

Hereinbefore, the logical isolation method and the physical isolation method for defective memory cell layers are described. According to such methods, if the number of defective blocks found in one or more memory cell layers in the stacked memory cell array is equal to or greater than a predetermined number, the memory cell layers can be logically and physically isolated. Thereby, the defective memory cell layers cannot be seen from outside and the memory cell chip can be used as a normal one having a low capacity. In addition, a potential defective block can be rejected by isolating the entire layer. In this case, the memory cell chip can be used as a normal one having a low capacity.

Second Embodiment

Next, a second embodiment in accordance with the present invention will be described. One of the differences between the first and second embodiments is that according to the first embodiment, logical isolation (address conversion) is performed in the flash memory chip 20, while according to the present embodiment, logical isolation is performed by the external host controller 9.

The detailed description will be given below. According to the NAND flash memory device, after power is turned on, the host controller 9 reads the set information and the like (Power on Read). At this time, the value of the Rom Fuse [3:0] is read to confirm which memory cell layer is defective. Then, based on the confirmation result, control is made such that data reading, writing, and erasing are performed only on a normal accessible memory cell layer.

Figure 12:
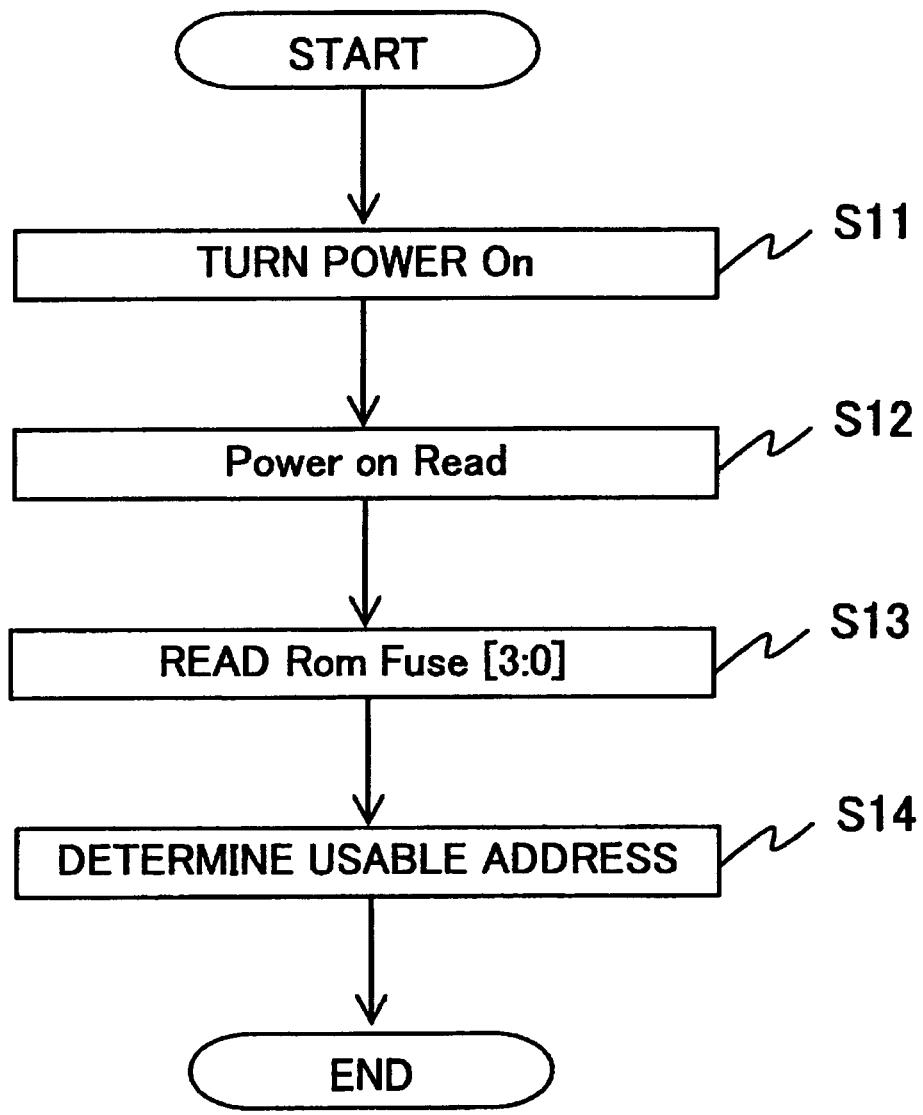
FIG. 12 is a flowchart in accordance with a second embodiment.

FIG. 12 shows a flowchart of the above operation.

(1) Power is turned on to the NAND flash memory device (Step S11).

(2) Next, the host controller 9 reads the set information and the like in the flash memory chip 20 (Step S12).

(3) Next, the host controller 9 reads the value of the Rom Fuse [3:0] from the flash memory chip 20 (Step S13).

(4) Next, based on the value of the Rom Fuse [3:0], the host controller 9 determines usable address (Step S14). For example, in Step S13, the Rom Fuse [3:0]=[0, 1, 0, 1] is assumed to be read. As described above, this value indicates that the Layers 0, 2 are defective, and the Layers 1, 3 are usable. Therefore, the usable blocks are the blocks 1024 to 2047 and the blocks 3072 to 4095.

The host controller 9 performs access (reading, writing, and erasing data) to only the usable address determined in Step S14 in the flash memory chip 20.

By doing as described above, the host controller 9 refers to the information of the Rom Fuse [3:0] to recognize whether the memory cell layer is defective or normal, and can access only the usable address in the normal memory cell layer.

Thereby, in the same manner as in the first embodiment, a defective memory cell layer can be logically isolated without performing address conversion in the flash memory chip 20 and in a manner in which the user of the flash memory device cannot recognize this operation.

Moreover, as understood from the above, the present embodiment has an advantage in that an address converting circuit need not be provided in the flash memory chip 20.

The logical isolation described in the present embodiment is performed, and further, the physical isolation described in the first embodiment may be performed.

Third Embodiment

Next, another logical isolation method by the host controller will be described. One of the differences between the present embodiment and the second embodiment is that a defective memory cell layer can be logically isolated without a need for the host controller to perform a specific address processing by using a conventional host controller specification (described later) and a fact that all the blocks in the defective memory cell layer are physically isolated in advance.

The conventional host controller specification will be described. Conventionally, at the time of power on, the host controller reads the information about all the blocks to recognize a defective block. According to the conventional specification, no voltage is transferred to the word lines WL or the selection gates SG of the defective block; when reading is performed, data of All "0" is read; when a block is read and the read result is All "0", the host controller recognizes the block as a defective block and subsequently does not access the block.

According to the present embodiment, since a defective memory cell layer is physically isolated in advance as described in the first embodiment, all the blocks in the defective memory cell layer are read as All "0". Therefore, according to the conventional specification, the host controller does not access (that is, logically isolates) the defective memory cell layer.

Figure 13:
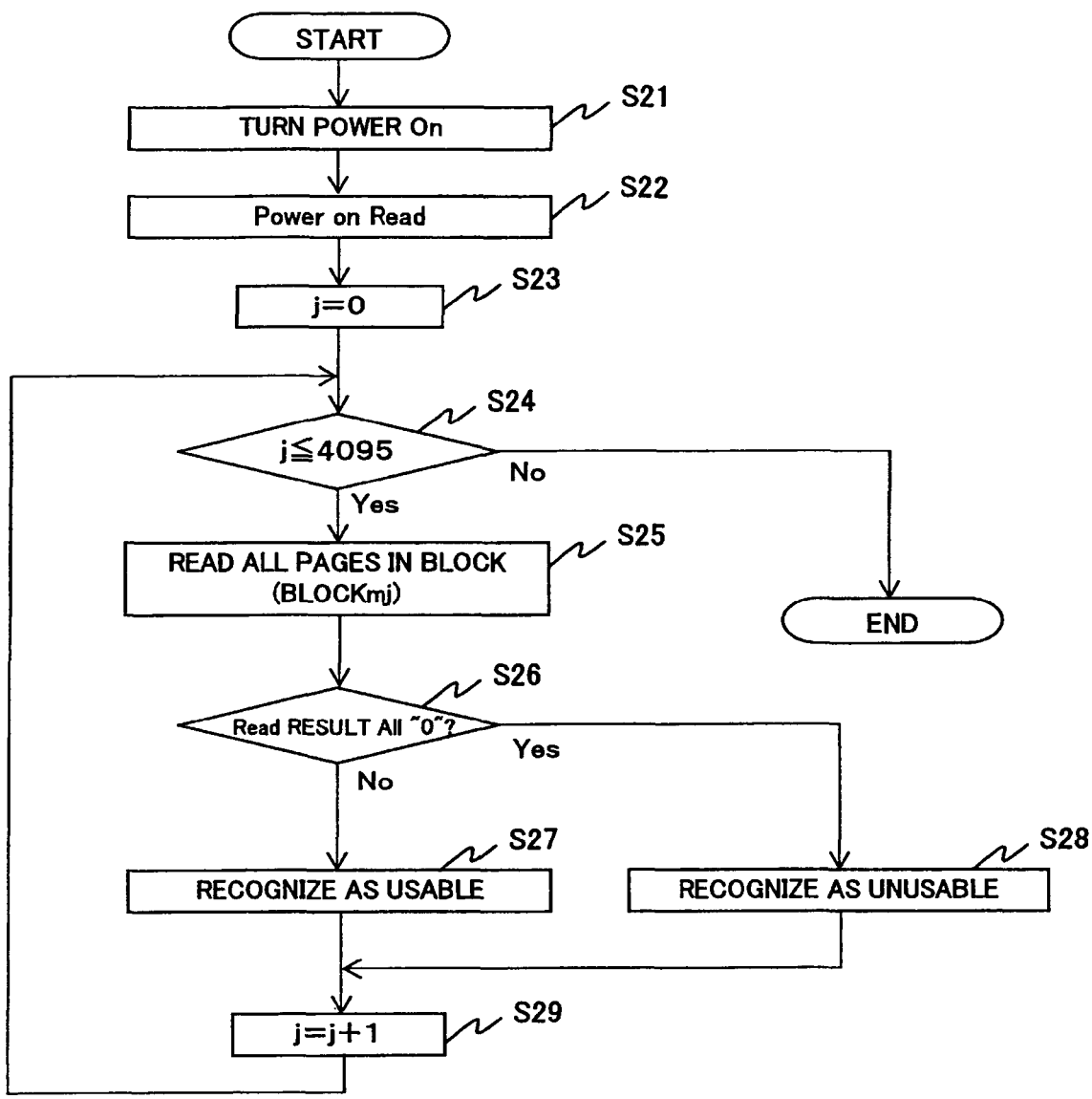
FIG. 13 is a flowchart in accordance with a third embodiment.

Hereinafter, with reference to the flowchart of FIG. 13, a further detailed description will be given. The configuration of the stacked memory cell array shown in FIG. 2A is assumed (total number of blocks is 4096).

(1) Power is turned on to the NAND flash memory device (Step S21).

(2) The host controller 9 reads the set information and the like in the flash memory chip 20 (Step S22).

(3) Set the block number j to 0 (Step S23).

(4) If the block number j is equal to or less than 4095, the process goes to Step S25, or otherwise, the operation terminates.

(5) The host controller 9 reads all the pages of the block (BLOCKmj) (Step S25). At this time, as described in the physical isolation method of the first embodiment, the flash memory chip 20 has already physically isolated all the blocks in the defective memory cell layer according to the information of the Rom Fuse [3:0], and thus, when a block in the defective memory cell layer is read, data of All "0" is read.

(6) If the result read in Step S25 is other than All "0", the process goes to Step S27; if the result is All "0", the process goes to Step S28 (Step S26).

(7) The host controller 9 recognizes the block (BLOCKmj) as usable, and the process goes to Step S29 (Step S27).

(8) The host controller 9 recognizes the block (BLOCKmj) as unusable and the process goes to Step S29 (Step S28).

(9) The block number j is incremented and the process goes to Step S24 (Step S29).

In the same manner as in the conventional operation, the host controller 9 reads, writes, or erases the address of the block recognized as usable and does not perform subsequent accesses to the block recognized as unusable.

By doing as above, the host controller 9 recognizes all the blocks in the defective memory cell layer as defective blocks and does not access the defective memory cell layer by using physical isolation of the defective memory cell layer based on the information of the Rom Fuse [3:0] performed by the flash memory chip 20.

For example, if the Rom Fuse [3:0]=[0, 1, 0, 1], all the blocks in the defective memory cell layers 0 and 2 are read as All "0" in Step S25. Therefore, the host controller 9 recognizes the blocks as defective blocks, and does not access subsequently. As a result, the host controller 9 accesses only the blocks in normal memory cell layers, namely, the blocks 1024 to 2047 and the blocks 3072 to 4095.

As understood from the above description, the present embodiment can perform logical isolation in the same manner as in the second embodiment, without performing address conversion in the flash memory chip 20 and in a manner in which the user of the flash memory device cannot recognize this operation.

This provides the flash memory chip 20 with an advantage in that there is no need to have an address converting circuit therein. Further, the present embodiment has another advantage in that the host controller need not perform a specific address processing and can use a conventional host controller as is.

Fourth Embodiment

Hereinafter, a fourth embodiment will be described. The present embodiment performs logical isolation on a defective memory cell layer by using the host controller specification in the same manner as in the third embodiment. One of the differences between the present embodiment and the third embodiment is that the present embodiment need not perform physical isolation on the defective memory cell layer described in the first embodiment.

Hereinafter, the present embodiment will be described in detail.

The operation of the host controller 9 is the same as in the third embodiment (see FIG. 13), except the flash memory chip 20 in accordance with the present embodiment does not perform physical isolation on the defective memory cell layer described in the first embodiment. Instead, in the above described Step S25, when the host controller 9 issues a data read request, the state machine 8 refers to the Rom Fuse [3:0] before the address data is output to the I/O line (data input/output line). If the request is data read to a block of the defective memory cell layer, a latch circuit of the sense amplifier (S/A) is controlled so as to output "0" onto the I/O line. Thereby, in the same manner as in the third embodiment, when the host controller 9 reads a block in the defective memory cell layer, data of All "0" is read.

Figure 15:
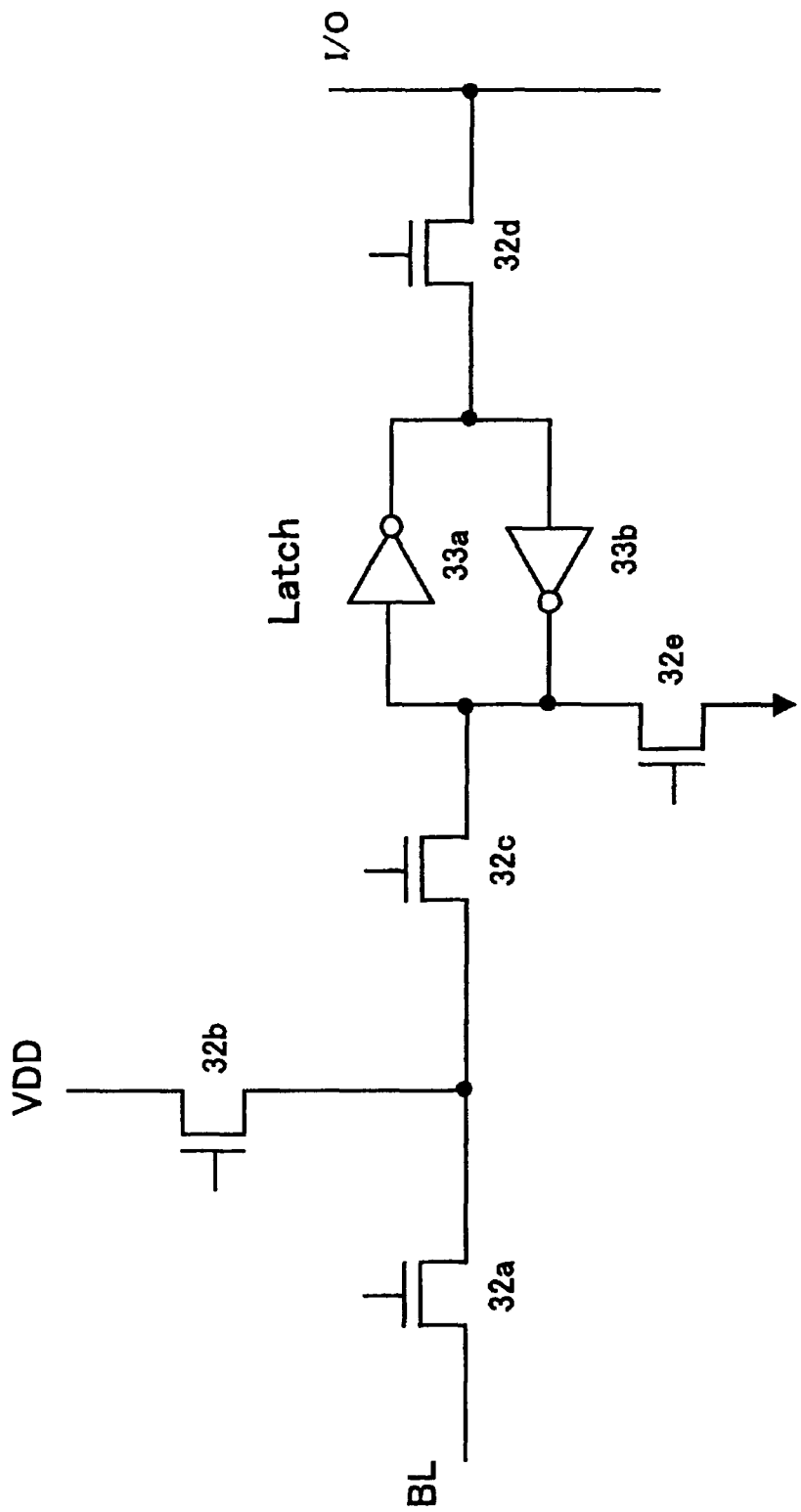
FIG. 15 is a drawing showing an example of a circuit configuration of a sense amplifier.

With reference to FIG. 15, a further detailed description will be given. FIG. 15 is a drawing showing an example of a circuit configuration of the sense amplifier. As understood from the Figure, the data output from the bit line (BL) passes through the transistors 32a, 32c, and is fetched by the latch circuit. Then, the state machine 8 refers to the Rom Fuse [3:0]. As a result, if the memory cell layer containing the read block is not defective, the transistor 32d is opened and the data held in the latch circuit is output to the I/O line. On the contrary, if the memory cell layer containing the read block is defective, the transistors 32b and 32c are opened and the potential of the input terminal of the latch circuit is raised to high voltage VDD so as to cause the output of the latch circuit to be "0". Afterward, when transistor 32d is opened, "0" is output to the I/O line.

Here, a case will be described in which according to a host controller specification, when the result of reading a block is All "1", the block is recognized as a defective block. In the same manner as before, the state machine 8 refers to the Rom Fuse [3:0]. As a result, if the memory cell layer containing the read block is not defective, the transistor 32d is opened and the data held in the latch circuit is output to the I/O line. On the contrary, if the memory cell layer containing the read block is defective, transistor 32e of FIG. 15 is opened and the potential of the input terminal of the latch circuit is grounded so as to cause the output of the latch circuit to be "1". Afterward, when transistor 32*d* is opened, "1" is output to the I/O line.

As understood from the above description, the present embodiment can cause the host controller 9 to recognize all the blocks in the defective memory cell layer as defective blocks without performing physical isolation. Thereby, the present embodiment can obtain the same effects as in the third embodiment.

Hereinbefore, four embodiments have been described.

As understood from the above description, isolation of a defective memory cell layer in accordance with the first to fourth embodiments is not limited to a flash memory, but can be applied to various kinds of semiconductor memory devices, For example, to a PCRAM (Phase Change RAM) and a ReRAM (Resistance RAM). For a PCRAM, the memory cell array may be one transistor/one resistor (1T/1R) or one diode/one resistor (1D/1R).

Figure 16:
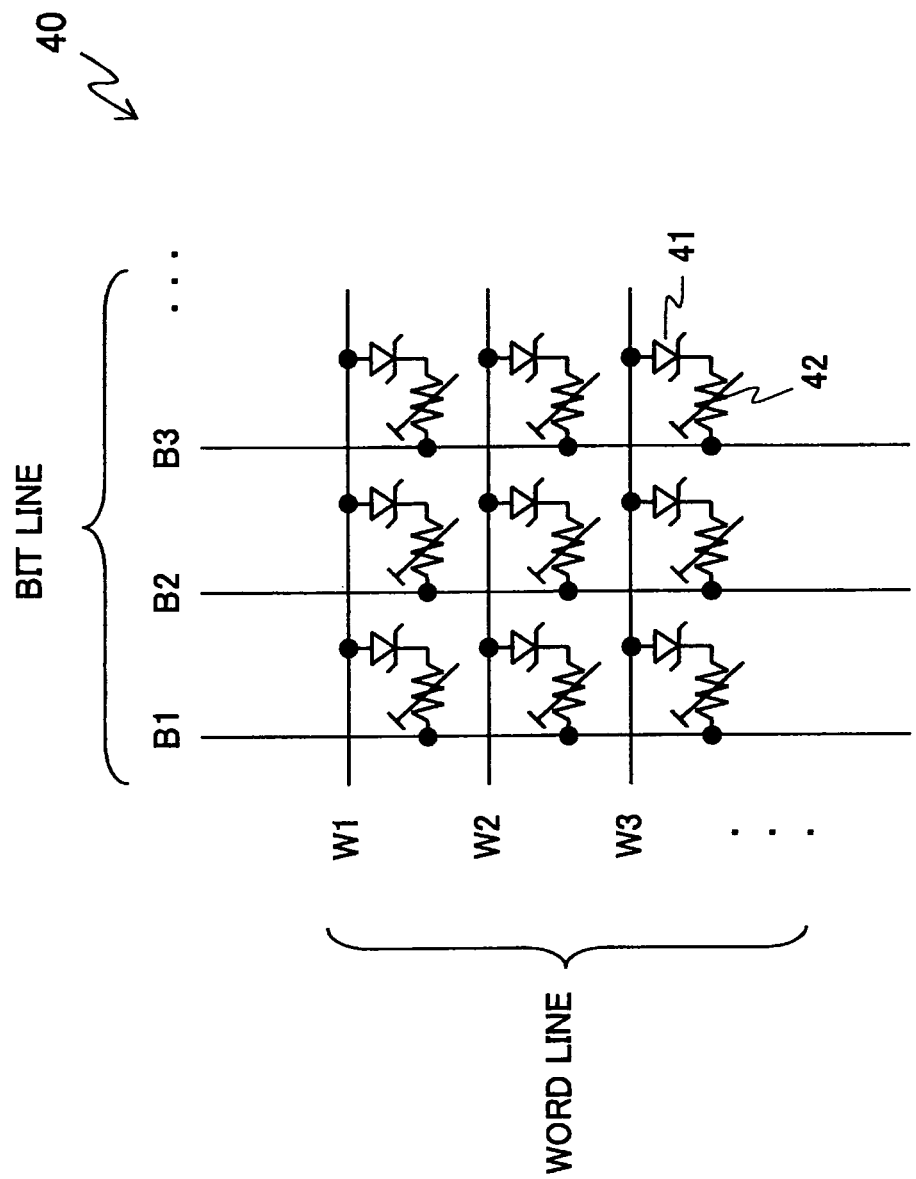
FIG. 16 is a drawing showing a configuration of a ReRAM memory cell array.

FIG. 16 shows an example of a configuration of the ReRAM memory cell array 40. As shown in the Figure, the memory cell of the ReRAM is configured by connecting the non-ohmic element 41 and the variable resistance element 42 in series. As the non-ohmic element 41, for example, various kinds of diodes such as a PN junction diode, a PIN diode, and a Schottky diode can be used. In addition, as the variable resistance element 42, a material which can change the resistance by means of voltage, current, heat, or chemical energy can be used.

Figure 17:
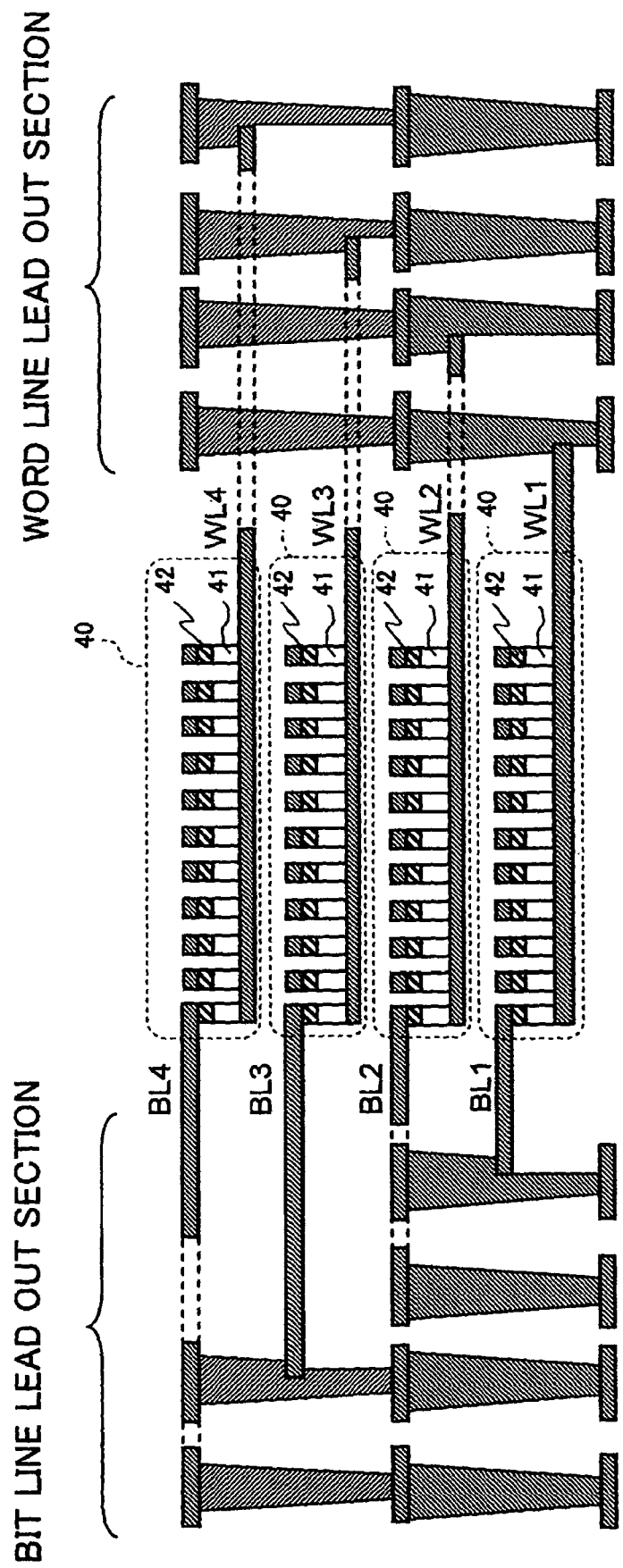
FIG. 17 is a sectional view of the ReRAM having four laminated memory cell layers.

FIG. 17 shows a sectional view of the ReRAM having four memory cell arrays 40 stacked in one chip. As understood from the Figure, each memory cell array 40 has a cross point cell structure. More specifically, elements are arranged such that an individual non-ohmic element 41 and an individual variable resistance element 42 are connected in series between an individual word line and an individual bit line. As shown in FIG. 17, each of the bit lines (BL1, BL2, BL3, and BL4) and each of the word lines (WL1, WL2, WL3, and WL4) of the individual layers are led out respectively. The bit lines are connected to the sense amplifier and the word lines are connected to the row control circuit, respectively.

It should be noted that the isolation of defective memory cell layers in accordance with the first to fourth embodiments described above does not depend on the method of laminating the memory cell layers. Therefore, as the method of laminating the memory cell layers, various methods can be assumed (such as planar lamination, cross point lamination, stepwise lamination, trench lamination, vertical lamination, and lamination against the substrate side).

Moreover, according to the methods described above, isolation is performed in units of memory cell layers, but the present invention is not limited to this. For example, a sub-layer is assumed to be obtained by dividing an individual memory cell layer into "N". It is also possible that the quality determination is made in units of sub-layers; the quality information is held in the Rom Fuse [4N−1:0] (for four memory cell layers); and then, the sub-layer determined as defective is logically and/or physically isolated by the above described methods.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

The invention claimed is:

1. A semiconductor memory device comprising:
a stacked memory cell array having a laminated plurality of memory cell layers, wherein each of the individual memory cell layers has a plurality of blocks;
a layer quality information storing circuit which can store layer quality information indicating whether the individual memory cell layer is a normal memory cell layer or a defective memory cell layer so as to identify the memory cell layer in which the number of defective blocks found is equal to or greater than a predetermined number as a defective memory cell layer and the other memory cell layers as normal memory cell layers; and
an address converting circuit in which if an externally input address input from outside corresponds to the block in the defective memory cell layer, the externally input address is address-converted so as to correspond to the block in the normal memory cell layer such that the defective memory cell layer is isolated.

2. The semiconductor memory device according to claim 1, further comprising switching circuits, each of which is provided for each of the blocks, and allows or prevents a connection between the block and a row control circuit which applies a predetermined voltage to a word line of the block.

3. The semiconductor memory device according to claim 2, further comprising:
a block address generating circuit which generates a block address of the block in the defective memory cell layer based on the layer quality information stored in the layer quality information storing circuit;
wherein the switching circuit prevents the connection between the block corresponding to the block address and the row control circuit.

4. The semiconductor memory device according to claim 2, further comprising:
a multiplexer circuit which generates one layer selection signal distributed to each of the switching circuits corresponding to each of the blocks in the memory cell layer based on the layer quality information stored in the layer quality information storing circuit, the layer selection signal being generated for each of the memory cell layers, wherein the layer selection signal is a first signal when the memory cell layer containing the block is the normal memory cell layer, and the layer selection signal is a second signal when the memory cell layer containing the block is the defective memory cell layer,
wherein the switching circuit prevents the connection between the row control circuit and the block when the layer selection signal is the second signal.

5. The semiconductor memory device according to claim 2, further comprising:
level shifter circuits, each of which is provided for each of the memory cell layers, wherein a gate voltage common to a plurality of the memory cell layers is input, the gate voltage being required for the switching circuit to allow the connection between the row control circuit and the block, wherein based on the layer quality information stored in the layer quality information storing circuit, each of the level shifter circuits outputs the gate voltage to the switching circuit corresponding to the block in the normal memory cell layer and does not output the gate voltage to the switching circuit corresponding to the block in the defective memory cell layer.

6. A semiconductor memory system comprising:
a memory chip; and
a controller;

the memory chip has:
- a stacked memory cell array having a laminated plurality of memory cell layers, wherein each of the individual memory cell layers has a plurality of blocks; and
- a layer quality information storing circuit which can store layer quality information indicating whether the individual memory cell layer is a normal memory cell layer or a defective memory cell layer so as to identify the memory cell layer in which the number of defective blocks found is equal to or greater than a predetermined number as a defective memory cell layer and the other memory cell layers as normal memory cell layers;

wherein the controller adds a control signal and an address to the memory chip and sends and receives data to and from the memory chip, based on the layer quality information stored in the layer quality information storing circuit, the controller determines whether the address to be added to the memory chip corresponds to the normal memory cell layer or corresponds to the defective memory cell layer, and does not provide access to the address which is determined to correspond to the defective memory cell layer such that the defective memory cell layer is isolated.

7. The semiconductor memory system according to claim 6, further comprising switching circuits, one of which is provided for each of the blocks, and allows or prevents a connection between the block and a row control circuit which applies a predetermined voltage to a word line of the block.

8. The semiconductor memory system according to claim 7, further comprising:
- a block address generating circuit which generates a block address of the block in the defective memory cell layer based on the layer quality information stored in the layer quality information storing circuit;
- wherein the switching circuit prevents the connection between the block corresponding to the block address and the row control circuit.

9. The semiconductor memory system according to claim 7, further comprising:
- a multiplexer circuit which generates one layer selection signal distributed to each of the switching circuits corresponding to each of the blocks in the memory cell layer based on the layer quality information stored in the layer quality information storing circuit, the layer selection signal being generated for each of the memory cell layers, wherein the layer selection signal is a first signal when the memory cell layer containing the block is the normal memory cell layer, and the layer selection signal is a second signal when the memory cell layer containing the block is the defective memory cell layer,
- wherein the switching circuit prevents the connection between the row control circuit and the block when the layer selection signal is the second signal.

10. The semiconductor memory system according to claim 7, further comprising:
- level shifter circuits, one of which is provided for each of the memory cell layers, wherein a gate voltage common to a plurality of the memory cell layers is input, the gate voltage being required for the switching circuit to allow the connection between the row control circuit and the block, wherein based on the layer quality information stored in the layer quality information storing circuit, each of the level shifter circuits outputs the gate voltage to the switching circuit corresponding to the block in the normal memory cell layer and does not output the gate voltage to the switching circuit corresponding to the block in the defective memory cell layer.

11. A semiconductor memory system comprising:
- a memory chip; and
- a controller;

the memory chip has:
- a stacked memory cell array having a laminated plurality of memory cell layers, wherein each of the individual memory cell layers has a plurality of blocks;
- a layer quality information storing circuit which can store layer quality information indicating whether the individual memory cell layer is a normal memory cell layer or a defective memory cell layer so as to identify the memory cell layer in which the number of defective blocks found is equal to or greater than a predetermined number as a defective memory cell layer and the other memory cell layers as normal memory cell layers; and
- switching circuits, each of which is provided for each of the blocks, prevents the connection between the block in the defective memory cell layer and the row control circuit and allows the connection between the block in the normal memory cell layer and the row control circuit;

wherein the controller adds a control signal and an address to the memory chip, and sends and receives data to and from the memory chip, wherein after the switching circuits in the memory chip prevent the connection between the block in the defective memory cell layer and the row control circuit, the controller reads all the memory cell layers and, based on the read result, recognizes the defective memory cell layer, and does not provide the subsequent access to the recognized defective memory cell layer such that the defective memory cell layer is isolated.

12. The semiconductor memory system according to claim 11, wherein the memory chip further includes a block address generating circuit which generates a block address of the block in the defective memory cell layer based on the layer quality information stored in the layer quality information storing circuit;
wherein the switching circuit prevents the connection between the block corresponding to the block address and the row control circuit.

13. The semiconductor memory system according to claim 11, wherein the memory chip further includes a multiplexer circuit which generates one layer selection signal distributed to each of the switching circuits corresponding to each of the blocks in the memory cell layer based on the layer quality information stored in the layer quality information storing circuit, the layer selection signal being generated for each of the memory cell layers, wherein the layer selection signal is a first signal when the memory cell layer containing the block is the normal memory cell layer, and the layer selection signal is a second signal when the memory cell layer containing the block is the defective memory cell layer,
wherein the switching circuit prevents the connection between the row control circuit and the block when the layer selection signal is the second signal.

14. The semiconductor memory system according to claim 11, wherein the memory chip further includes level shifter circuits, one of which is provided for each of the memory cell layers, wherein a gate voltage common to a plurality of the memory cell layers is input, the gate voltage being required for the switching circuit to allow the connection between the row control circuit and the block, wherein based on the layer quality information stored in the layer quality information storing circuit, each of the level shifter circuits outputs the gate voltage to the switching circuit corresponding to the block in the normal memory cell layer and does not output the gate voltage to the switching circuit corresponding to the block in the defective memory cell layer.

15. A semiconductor memory system comprising:
a memory chip; and
a controller;
the memory chip has:
- a stacked memory cell array having a laminated plurality of memory cell layers, wherein each of the individual memory cell layers has a plurality of blocks;
- a layer quality information storing circuit which can store layer quality information indicating whether the individual memory cell layer is a normal memory cell layer or a defective memory cell layer so as to identify the memory cell layer in which the number of defective blocks found is equal to or greater than a predetermined number as a defective memory cell layer and the other memory cell layers as normal memory cell layers;
- a sense amplifier circuit having a latch circuit for holding data output from a bit line before the data is output to a data input/output line; and
- a state machine which refers to the layer quality information storing circuit, and if the data is read from the block in the normal memory cell layer, outputs the first data or the second data held in the latch circuit to the data input/output line, while if the data is read from the block in the defective memory cell layer, outputs the first data to the data input/output line by controlling the latch circuit; and
wherein the controller adds a control signal and an address to the memory chip and sends and receives data to and from the memory chip, wherein the controller reads all the memory cell layers, and if all the data read from the block through the data input/output line is the first data, the controller recognizes the block as a defective block and does not provide the subsequent access to the recognized defective block such that the defective memory cell layer is isolated.

16. The semiconductor memory device according to claim 1, wherein memory cells in the individual memory cell layer are non-volatile MOS transistors.

17. The semiconductor memory device according to claim 1, wherein each of the memory cells in the individual memory cell layers is configured by connecting a non-ohmic element and a variable resistance element in series.

18. The semiconductor memory device according to claim 17, wherein the stacked memory cell array is configured by laminating a plurality of the memory cell layers in a cross point structure.

19. A three-dimensionally stacked NAND flash memory device comprising:
- a stacked memory cell array having a laminated plurality of memory cell layers, wherein each of the individual memory cell layers has a plurality of blocks;
- a layer quality information storing circuit which can store layer quality information indicating whether the individual memory cell layer is a normal memory cell layer or a defective memory cell layer so as to identify the memory cell layer in which the number of defective blocks found is equal to or greater than a predetermined number as a defective memory cell layer and the other memory cell layers as normal memory cell layers; and
- an address converting circuit in which if an externally input address input from outside corresponds to the block in the defective memory cell layer, the externally input address is address-converted so as to correspond to the block in the normal memory cell layer such that the defective memory cell layer is isolated.

20. The three-dimensionally stacked NAND flash memory device according to claim 19, further comprising switching circuits, each of which is provided for each of the blocks, and allows or prevents a connection between the block and a row control circuit which applies a predetermined voltage to a word line of the block.

21. The three-dimensionally stacked NAND flash memory device according to claim 20, further comprising
a block address generating circuit which generates a block address of the block in the defective memory cell layer based on the layer quality information stored in the layer quality information storing circuit;
wherein the switching circuit prevents the connection between the block corresponding to the block address and the row control circuit.

22. The three-dimensionally stacked NAND flash memory device according to claim 20, further comprising
a multiplexer circuit which generates one layer selection signal distributed to each of the switching circuits corresponding to each of the blocks in the memory cell layer based on the layer quality information stored in the layer quality information storing circuit, the layer selection signal being generated for each of the memory cell layers, wherein the layer selection signal is a first signal when the memory cell layer containing the block is the normal memory cell layer, and the layer selection signal is a second signal when the memory cell layer containing the block is the defective memory cell layer,
wherein the switching circuit prevents the connection between the row control circuit and the block when the layer selection signal is the second signal.

23. The three-dimensionally stacked NAND flash memory device according to claim 20, further comprising
level shifter circuits, each of which is provided for each of the memory cell layers, wherein a gate voltage common to a plurality of the memory cell layers is input, the gate voltage being required for the switching circuit to allow the connection between the row control circuit and the block, wherein based on the layer quality information stored in the layer quality information storing circuit, each of the level shifter circuits outputs the gate voltage to the switching circuit corresponding to the block in the normal memory cell layer and does not output the gate voltage to the switching circuit corresponding to the block in the defective memory cell layer.

* * * * *